United States Patent
Magno et al.

(10) Patent No.: US 10,680,185 B2
(45) Date of Patent: Jun. 9, 2020

(54) ACTIVE MATRIX ENHANCED ORGANIC LIGHT EMITTING DIODE DISPLAYS FOR LARGE SCREEN GRAPHIC DISPLAY APPLICATIONS

(71) Applicant: RED BANK TECHNOLOGIES LLC, Red Bank, NJ (US)

(72) Inventors: John N. Magno, St. James, NY (US); Gene C. Koch, Toms River, NJ (US)

( * ) Notice: Subject to any disclaimer, the term of this patent is extended or adjusted under 35 U.S.C. 154(b) by 0 days.

(21) Appl. No.: 16/238,569

(22) Filed: Jan. 3, 2019

(65) Prior Publication Data
US 2019/0207126 A1    Jul. 4, 2019

Related U.S. Application Data

(60) Provisional application No. 62/613,591, filed on Jan. 4, 2018.

(51) Int. Cl.
| | | |
|---|---|---|
| *H01L 51/50* | (2006.01) | |
| *H01L 51/56* | (2006.01) | |
| *H01L 51/00* | (2006.01) | |
| H01L 27/32  | (2006.01) | |

(52) U.S. Cl.
CPC ...... *H01L 51/0076* (2013.01); *H01L 51/0012* (2013.01); *H01L 27/3211* (2013.01); *H01L 51/5012* (2013.01); *H01L 51/5056* (2013.01); *H01L 51/5072* (2013.01); *H01L 2251/558* (2013.01)

(58) Field of Classification Search
CPC ......... G02F 1/1334; G02F 2001/13756; H01L 51/56; H01L 51/0076; H01L 51/5237
See application file for complete search history.

(56) References Cited

U.S. PATENT DOCUMENTS

| | | | |
|---|---|---|---|
| 2004/0069995 A1 | 4/2004 | Magno et al. | |
| 2010/0025641 A1* | 2/2010 | Jimbo | G02B 5/208 252/587 |
| 2017/0229740 A1* | 8/2017 | Preezant | H01G 11/26 |

FOREIGN PATENT DOCUMENTS

| | | |
|---|---|---|
| WO | 2016209797 | 12/2016 |
| WO | 2017004031 | 1/2017 |
| WO | 2017156433 | 9/2017 |

* cited by examiner

*Primary Examiner* — Caridad Everhart
(74) *Attorney, Agent, or Firm* — Reed Smith LLP

(57) ABSTRACT

A light emitting photonic crystal composed of chiral liquid crystalline material and having an organic light emitting diode and methods of making the same are disclosed. An organic light emitting diode disposed within a photonic structure having a band-gap, or stop-band, allows the photonic structure to emit light at wavelengths occurring at the edges of the band-gap.

6 Claims, 1 Drawing Sheet

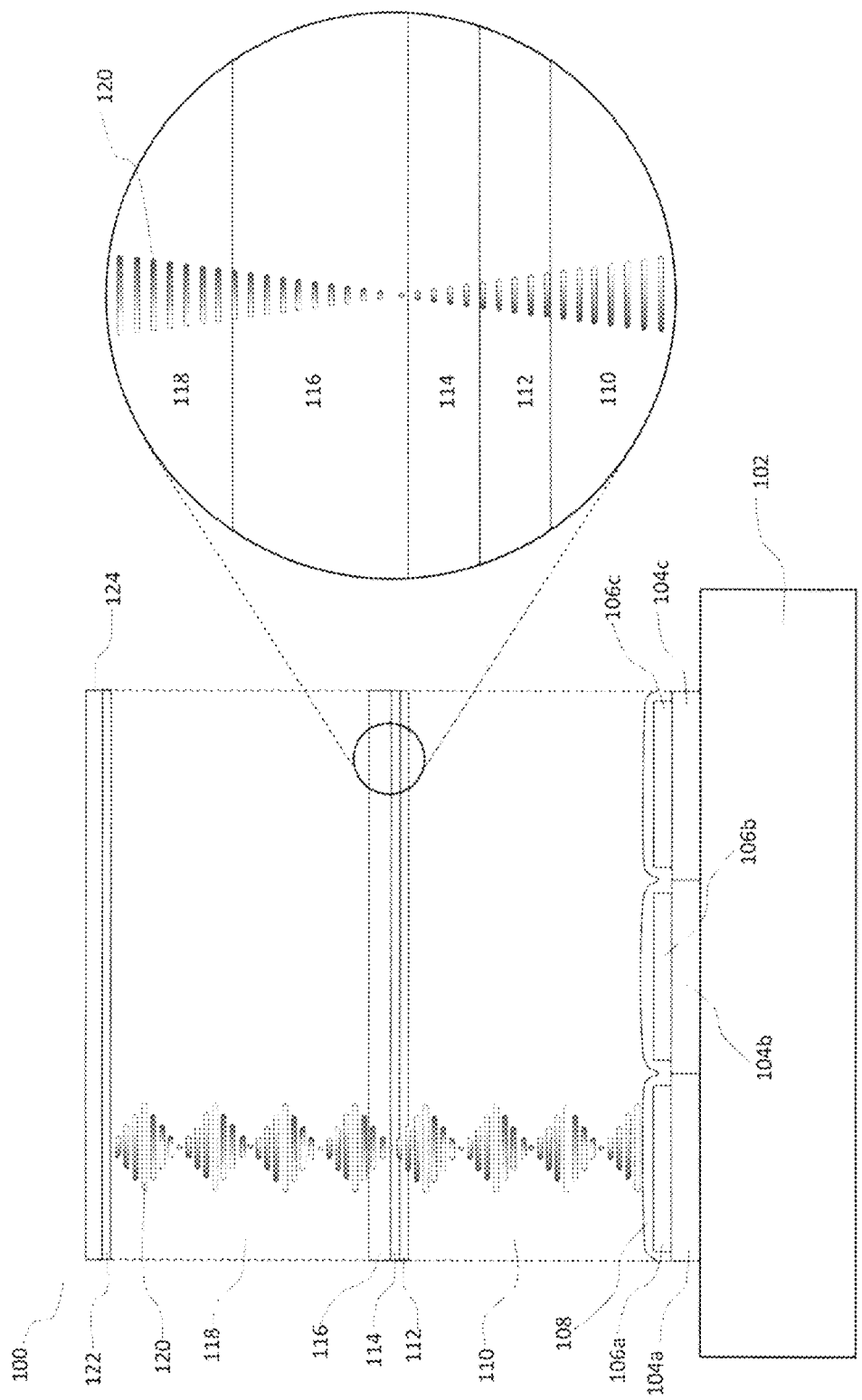

ACTIVE MATRIX ENHANCED ORGANIC LIGHT EMITTING DIODE DISPLAYS FOR LARGE SCREEN GRAPHIC DISPLAY APPLICATIONS

CROSS REFERENCE TO RELATED APPLICATION

This application claims the benefit under 35 § 119(e) of the earlier filing date of U.S. Provisional Patent Application No. 62/613,591 filed on Jan. 4, 2018, the disclosure of which is incorporated by reference herein.

BACKGROUND

PCT patent application PCT/US16/39802 describes active matrix driven display devices that combine organic light emitting diodes (OLEDs) that emit light from a structure comprising a photonic crystal with photoluminescent overlays that are energized into light emission by absorption of light entitled by the OLEDs. Two types of devices are described. The first type combines a feedback enhanced OLED devices (FE-OLED) of the type described in U.S. Patent Application Publication Number 20040069995 with photoluminescent material overlays. The second type of device described combines band edge emission enhanced OLED devices (BE-OLEDs) of the type described in International Patent Application Number PCT/US16/38479 with photoluminescent material overlays. Light from a matrix array of the OLED devices is absorbed by a Corresponding matrix array of photoluminescent material pixels or subpixels that overlay the OLED devices and are spatially registered to them.

In both of the types of devices described above the display functions because the OLEDs produce light by stimulated emission of light within a structures comprising one or more 1-D photonic crystals and as such are vertically emitting. This vertical emission of light is well collimated and as a result there is no crosstalk such as would occur if light from one OLED in the matrix was absorbed by a subpixel of material overlaying an adjacent OLED in the matrix array. Thus, the vertical emission properties of the FE-OLEDs or BE-OLEDs make production of useful device possible. Active matrix OLED displays of this type are advantageous in that all of the OLED devices in the matrix array can produced from the same violet or deep blue light emitting OLED materials thus considerably reducing the number of manufacturing process steps as compared to an full color, active matrix display that utilizes an array of three kinds of OLEDs that emit red, green, and blue light respectively. Furthermore, since it has been demonstrated that BE-OLEDs can produce light with high power efficiency (e.g. over 300 lumens/waft), active matrix displays of this type can be made to be much more energy efficient than conventional active matrix OLED displays.

A problem with both the FE-OLED-based and BE-OLED-based displays described in PCT/US16/39802 is that in order to build up the required photonic crystal structures many layers (around sixteen) of transparent insulating layer must be vacuum deposited. Therefore, even though the use of OLEDs emitting only one color of light reduces the number of manufacturing steps, the manufacturing process will still be costly.

BRIEF DESCRIPTION OF THE DRAWINGS

FIG. 1 illustrates an embodiment of the invention.

DETAILED DESCRIPTION

FIG. 1 illustrates a single RGB color pixel within an alternative and improved embodiment 100 of the invention described in PC/US16/39802 the vacuum deposited layered structures that make up a BE-OLED are replaced by a chiral liquid crystalline structure built up by solvent casting layers and then photopolymerizing them. This embodiment utilizes OLED devices of the type described in International Patent Application Number PCT/US17/21867, chiral liquid crystalline, band edge emission enhanced organic light emitting diodes (C-OLEDs). Embodiment 100 comprises a transparent substrate 102 that may be formed from glass or clear plastic; red (104a), green (104b) and blue (104c) photoluminescent material layers that delineate the sub-pixels that make up the RGB color pixel sub-pixel anodes 106a, 106b and 106c; liquid crystal photoalignment and hole injection layer 108; p-doped, polymerized chiral liquid crystalline hole transporting layer 110; polymerized chiral liquid crystalline hole transporting layer 112; polymerized chiral liquid crystalline light emitting layer 114; polymerized chiral liquid crystalline electron transporting layer 116; n-doped, polymerized chiral liquid crystalline electron transporting layer 118; electron injection layer 122; and row cathode 124. Each row cathode/sub-pixel anode combination addresses a single sub-pixel and is connected to and driven by a dedicated. TFT-based microcircuit (not shown) that is built up on the transparent substrate. Microcircuits of this type that are used to drive pixels in active matrix OLEDs are well-known in the art. A helical structure (portrayed by 120) is spontaneously formed when the chiral liquid crystalline layers are sequentially solvent east down onto the liquid crystal photoalignment and hole injection layer 108 and photopolymerized. This structure pervades the entirety of layers 110, 112, 114, 116, and 118. The thickness of the polymerized chiral liquid crystalline light emitting layer may be 10% or less than the total combined thicknesses of all of the polymerized chiral liquid crystalline layers. Each layer has a plane and the polymerized chiral nematic liquid crystal material comprising each layer comprises molecules having long axes aligned parallel with said plane of said layer. The polymerized chiral nematic material in each layer spontaneously adopts helical structure with a helical pitch, and the helical pitch of the helical structure of the polymerized chiral nematic material in each layer is the same. The polymerized chiral liquid crystalline layers may all have the same chiral pitch. The light emitting layer further comprises an electroluminescent material which emits light into the band edge light propagation modes of the photonic crystal. The polymerized chiral liquid crystalline layers may all have the same ordinary and extraordinary retractive indices.

The layers of chiral nematic material are each laid down by a solvent casting method and then polymerized by exposure with radiation such as ultraviolet light. Each layer is laid down on top of the previous layer and then polymerized in succession.

Component layers 106a, 106b, 106c, 108, 110, 112, 114, 116, 118, 122, and 124 combine to make up C-OLEDs as are described in PCT/US17/21867. That patent application describes greater detail how a C-OLED may be fabricated and how the helical structure 120 functions photonic crystal. The photonic crystal formed the chiral liquid crystalline material in layers 110, 112, 114, 116, and 118 induces stimulated light emission in band edge modes from the luminescent material in layer 114. The light thus emitted is emitted ally and is well collimated. The luminescent material in layer 114 is a deep blue or violet emitting electroluminescent material such as fac-Iridium(III) tris(1-phenyl-3-methylbenzimidazolin-2-ylidene-C,C2'). When a particular sub-pixel such as that overlaying photoluminescent layer 104a is energized by application of a potential difference between its anode and cathode by means of its dedicated TFT microcircuit, deep blue or violet light is emitted vertically either in the direction of layer 104a or cathode 124. Cathode 124 is fabricated from a reflective metal and is properly located in relation to the chiral structure such that it reflects light back in the direction of layer 104a. Thus substantially all light produced strikes layer 104a producing tin this case) red photoluminescence. Similarly layers 104b and 104c can be induced to produce green and blue light respectively when the proper TFT microcircuits and anode/cathode combinations are energized. In this way display screen composed of a great many pixel structures like that shown in FIG. 1 can be induced to display video information.

Embodiment 100 is a "bottom emitting" device in that the light that is produced passes out through the transparent anodes and substrate. The same principle can be used to produce a "top emitting" device. In this case a reflector is positioned under anodes 106a, 106b, and 106c; row cathodes 124 are transparent cathodes as are well-known in the art; and photoluminescent layers 104a, 104b, and 104c are formed on top of row cathodes 124.

If not otherwise stated herein, any and all patents, patent applications, patent publications, articles and other printed publications discussed or mentioned herein are hereby incorporated by reference as if set forth in their entirety herein.

It will be appreciated by those of ordinary skill in the art that the disclosed apparatus may be comprised of a wide and equivalent range of apparatus and components and nothing herein is intended to limit the scope of the disclosed inventions or any embodiments thereof.

We claim:

1. A light emitting device comprising:
a light emitting photonic crystal having organic electroluminescent emitter material disposed within the photonic crystal; and
a photoluminescent material disposed upon a surface of the light emitting photonic crystal, such that light emitted by the light emitting photonic crystal causes photoexcitation within the photoluminescent material;
wherein the light emitting phonic crystal is composed of polymerized chiral nematic liquid crystal material,
wherein the polymerized chiral nematic liquid crystal material comprises:
a hole transporting layer comprising the polymerized chiral nematic liquid crystal material; and
a light emitting layer comprising the polymerized chiral nematic liquid crystalline material; and
an electron transporting layer comprising the polymerized chiral nematic liquid crystal material;
wherein each of said layers has a thickness and said light emitting layer has a respective thickness that is 10% or less of a total thickness of all the polymerized chiral nematic liquid crystal material containing layers combined.

2. The light emitting device of claim 1, wherein each layer has a plane and the polymerized chiral nematic liquid crystal material comprising each layer comprises molecules having long axes aligned parallel with said plane of said layer.

3. The light emitting device of claim 1, wherein the polymerized chiral nematic material in each layer spontaneously adopts a helical structure with a helical pitch, and the helical pitch of the helical structure of the polymerized chiral nematic material in each layer is the same.

4. The light emitting device of claim 1, wherein the layers comprising polymerized chiral liquid crystal combine together to form a photonic crystal.

5. The light emitting device of claim 1, wherein said light emitting layer further comprises an electroluminescent material which emits light into band edge light propagation modes of the light emitting photonic crystal.

6. The light emitting device of claim 1, wherein the layers comprising polymerized chiral liquid crystal all have same ordinary and extraordinary refractive indices.

* * * * *